(12) United States Patent
Mondello et al.

(10) Patent No.: US 7,646,655 B2
(45) Date of Patent: Jan. 12, 2010

(54) MEMORY DEVICE WITH FAIL SEARCH AND REDUNDANCY

(76) Inventors: Antonino Mondello, Via Comunale Santo, 370/A, 98148 Messina (IT); Alessandro Tumminia, Via Nebrodi, 30, 95123 Catania (IT); Luigi Buono, Via Malerba, 6, 95030 Gravina di Catania (IT)

( * ) Notice: Subject to any disclaimer, the term of this patent is extended or adjusted under 35 U.S.C. 154(b) by 249 days.

(21) Appl. No.: 11/780,581

(22) Filed: Jul. 20, 2007

(65) Prior Publication Data

US 2008/0049514 A1 Feb. 28, 2008

(30) Foreign Application Priority Data

Jul. 20, 2006 (EP) .................................. 06425503

(51) Int. Cl.
*G11C 7/00* (2006.01)
(52) U.S. Cl. ........................................ 365/201; 365/200
(58) Field of Classification Search ................. 365/201, 365/200
See application file for complete search history.

(56) References Cited

U.S. PATENT DOCUMENTS 6,067,262 A * 5/2000 Irrinki et al. ................. 365/201
6,233,182 B1 * 5/2001 Satou et al. .................. 365/200
6,829,176 B2 * 12/2004 Callaway et al. ............ 365/201
2002/0001241 A1 1/2002 Hotaka ........................ 365/200

FOREIGN PATENT DOCUMENTS

EP 1453062 9/2004

OTHER PUBLICATIONS

"Programmable Built-In Self-Testing of Embedded RAM Clusters in System-on-Chip Architectures", Benso et al., Testing and Verification of Communication System-on-Chip Devices, IEEE Communications Magazine, Sep. 2003, pp. 90-97.

* cited by examiner

*Primary Examiner*—Anh Phung
(74) *Attorney, Agent, or Firm*—Schwabe, Williamson & Wyatt, P.C.

(57) ABSTRACT

An automatic redundancy system may exploit an existing microprocessor management system on chip for carrying out autonomously, without communicating with an external testing machine, the operations of: writing data in the memory array according to one or more pre-established test patterns, verifying data successively read from the memory array, and substituting failed elements of the memory array with equivalent redundancy structures. A logic structure may detect and store memory array failures upstream of the output data path. Thereby, data collection relating to failures may be accomplished more quickly and without any interaction with the testing machine apart from communicating the end of the execution of the redundancy process.

18 Claims, 6 Drawing Sheets

Programmed cells ("0") dark
Erased cells ("1") white

DIAGONAL

CHECKERBOARD

CHECKERBOARD_N

MEMORY DEVICE WITH FAIL SEARCH AND REDUNDANCY

FIELD OF THE INVENTION

The invention relates to management of failed memory cells in memory devices, more particularly, FLASH memory devices.

BACKGROUND OF THE INVENTION

The market for FLASH memory devices offers small margins for manufacturers of memory devices. The industry is studying new manufacturing techniques and methods to improve both yield and productivity. A known technique for increasing yield comprises implementing row, column, and sector redundancy. These techniques, even if they increase the yield, also increase relatively the time used for testing the devices on wafer, for example, Electric Wafer Sort (EWS). This increase in testing time is because the test machine, besides detecting the physical position of the failed element in the array, may implement a series of procedures for mapping the failed element (row, column, sector) onto an available valid spare resource. This may limit productivity, and for improving it, further investments are made for improving the throughput of validated devices.

The devices being fabricated may be usually tested on wafer using techniques, for example, EWS, for determining the presence of failed elements (rows, columns, or whole sectors), and for repairing them by substituting the failed element with spare resources available on chip. As schematically depicted in FIG. 1A, the whole test, substitution, and verification process may be carried out by the test machine establishing communication with each single die in order to: 1. carry out specific tests for determining the presence of eventual failures; 2. store (in the test machine) the position of the failures detected in the memory array of cells; 3. apply the redundancy rules of the particular architecture (written in the software for managing the test machine) used for mapping correctly the failed element on an equivalent spare (redundancy) element; and 4. write in a nonvolatile fashion in the memory under test the information obtained in the previous steps.

This process may have two drawbacks: complex test programs may be developed for carrying out the search of and implementing complex techniques for repairing eventual failures; and the time used by the test machine for testing each single die, for determining eventual failures, and for arranging substitution by spare resources, where it is possible, may be relatively long. This resulting increase in yield due to redundancy may reduce productivity because of testing. It is possible to compensate for this reduction of productivity by buying and installing numerous test machines.

In order to improve productivity, architectures of memory devices that contemplate integrating in the same device dedicated structures for simplifying the operations carried out by the test machine have been disclosed. The prior published European patent application No. EP 1,624,465 "Programmable multi-mode built-in self-test and self-repair structure for embedded memory arrays," in the name of Assignee of the present application, discloses an architecture developed to provide a tool for the analysis of failures that may suggest possible effective modifications of certain process conditions for reducing the number of failures. The article "Programmable Built-In Self-Testing of Embedded RAM Clusters in System-on-Chip Architectures", by A. Benso, et al., IEEE Communications Magazine, September 2003, pages 90 to 97, provides another example of these known approaches.

These known techniques may have the drawback of using integrated complex dedicated structures, such as dedicated processors, for realizing a so-called Built In Self Test (BIST) system or, as in the case of the above mentioned prior application, for realizing a Built In Self Test and Self Repair (BISR) system. The realization of which uses silicon real estate. This may render these architectures unusable on stand alone FLASH memory devices. It may be employed in systems on chip or on complex architectures of chips that include, for commercial purposes, microcontrollers and large volatile memory arrays (RAM). Moreover, these systems may contemplate an interaction with the EWS test machine for collecting verification data when reading the memory and for carrying out redundancy operations and read operations. These operations are carried out for verifying the correct functionality of memory locations and involve the whole data path of the memory device.

On another account, modern nonvolatile FLASH memory devices (even stand alone devices) may include a small microcontroller system for managing operations of the memory, the system comprising a microprocessor and a related ROM storing program codes for executing the various functions. The system may also comprise an internal address counter, one or more auxiliary RAM memory arrays, for example, for managing the protection of sectors and for storing configuration information of the device that are read during the turn on phase, and arrays of CAMs or a reserved sector of the non volatile memory array, inaccessible by the user, in which, during a phase of test on wafer of the device being fabricated, redundancy and configuration information of the inner circuitry and other specific parameters of the device under test are permanently written.

SUMMARY OF THE INVENTION

An approach is provided to the above mentioned problems of improving the yield and the productivity of fabrication of nonvolatile FLASH memory devices comprising a microprocessor system for managing the functions of the memory device.

The object of reducing the time used for executing the tests, substituting for failed parts of the array of nonvolatile memory cells with redundancy structures, and limiting the interaction between the EWS test machine and each device being fabricated and without a burdensome increase in the silicon area occupied by the device may be provided by the architecture.

An automatic redundancy system is provided and may exploit the existing management microprocessor system available on chip for carrying out automatically, without communicating with the external test machine, the operations of: writing data in the memory array according to one or more pre-established test schemes, verifying data successively read from the memory array, and substituting for failed elements of the array with equivalent redundant structures. The redundancy system may utilize a logic structure for detecting and storing eventual failed elements of the array of memory cells. This may occur upstream of the output data path of the memory device and speeds up data collection of eventual failures without any interaction with the external test machine, apart from communicating the end of its task.

Moreover, a logic circuit implementing specific redundancy rules of the device interacts with the microprocessor of the device to map the failed element on an available analogous spare element, by registering data of the effected substitution in a reserved sector of memory cells or in other nonvolatile memory elements, such as, in an array of CAMs. The above mentioned drawbacks may be overcome by a process of carrying out a writing, verification, and substitution of failed elements that, once started, is carried out in a substantially autonomous and completely automatic manner without any intervention of an operator through the test machine. Practically, the process may generate a validation or an irrecoverable-fail flag of the device being fabricated. In the latter case, the device may be discarded. Moreover, the realization of the dedicated structures in the device may have a very low impact on the area occupied by the device.

DETAILED DESCRIPTION OF THE PREFERRED EMBEDMENTS

Figure 1A:
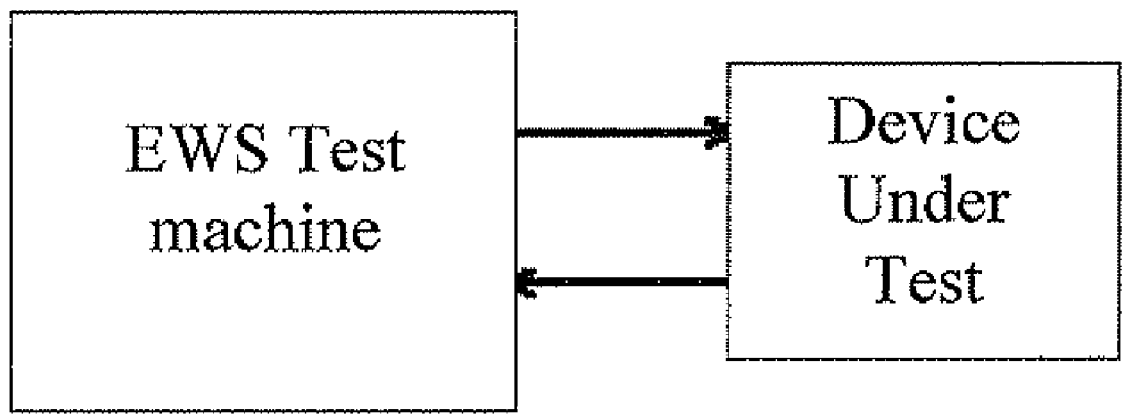
FIG. 1A shows schematically the interaction between the EWS test machine and the device under test, according to the prior art.
Figure 1B:
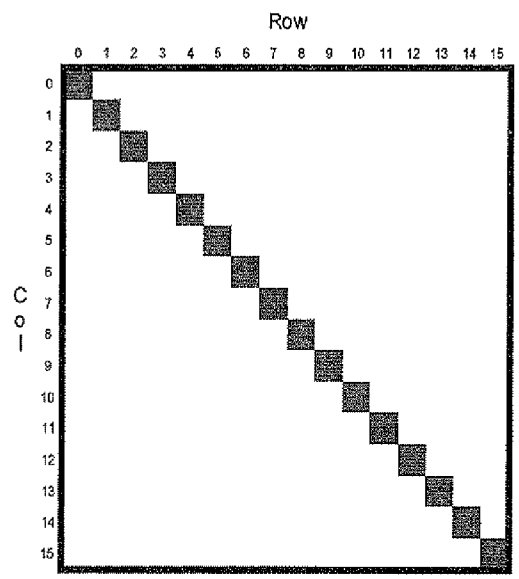
FIG. 1B shows different test patterns that are used for finding eventual failures in the array, according to the prior art.
Figure 1B:
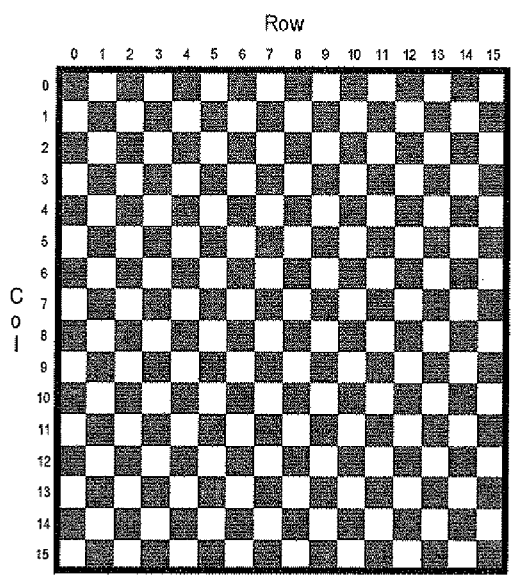
Figure 1B:
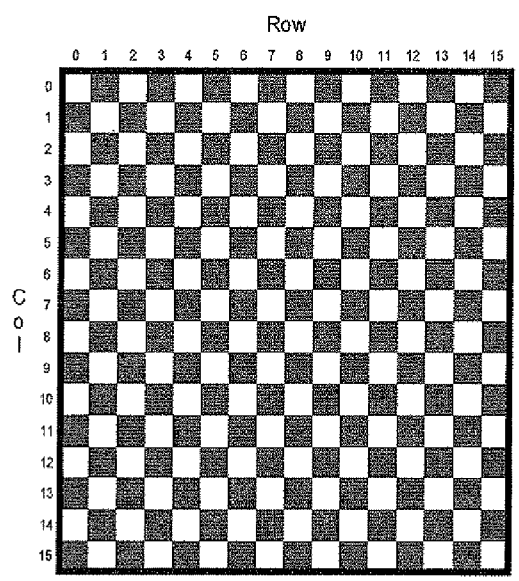

The process comprises executing a certain set of algorithms, written in an internal ROM, for searching eventual electric failures in the memory cell array. These algorithms comprise two types. The task of the first type of algorithms comprises writing in the array, that is, programming the cells of the array according to a series of specific patterns such as the Checkerboad pattern, the inverted Checkerboard pattern, and the Diagonal pattern, all depicted in FIG. 1B, besides the ALLO pattern. The task of a second type of algorithms comprises verifying, by a read operation, the physical state of the cells of the array in respect to internal reference states for the particular write pattern of the cells and signaling to a logic controller eventual failures (difference between the read value and the expected value) detected during the execution of the verification scanning.

In practice, it is assumed that the die receive, from the test machine, a single command for starting the execution of the test routines, the codes of which may be stored in the same Read Only Memory (ROM) of the management system, properly dimensioned such to start the relative scanning of the whole array from a certain address (for example 0x000000, row 0, column 0). This means that the communication between the test machine and the die may be carried out in "one shot" fashion, that is, only a start-up command of the testing and failed elements substitution process is issued to the die. The internal redundancy system of which carries out: the failure search tests, the storage of the failure location data in a RAM array of the device, the application of specific redundancy rules, and the writing in the nonvolatile storage elements present in the die, such as, a CAM array or a reserved FLASH sector (called also power-on sector) of the FLASH memory array, the mapping of the element in which a fail has been detected on a certain corresponding redundancy element.

Figure 2:
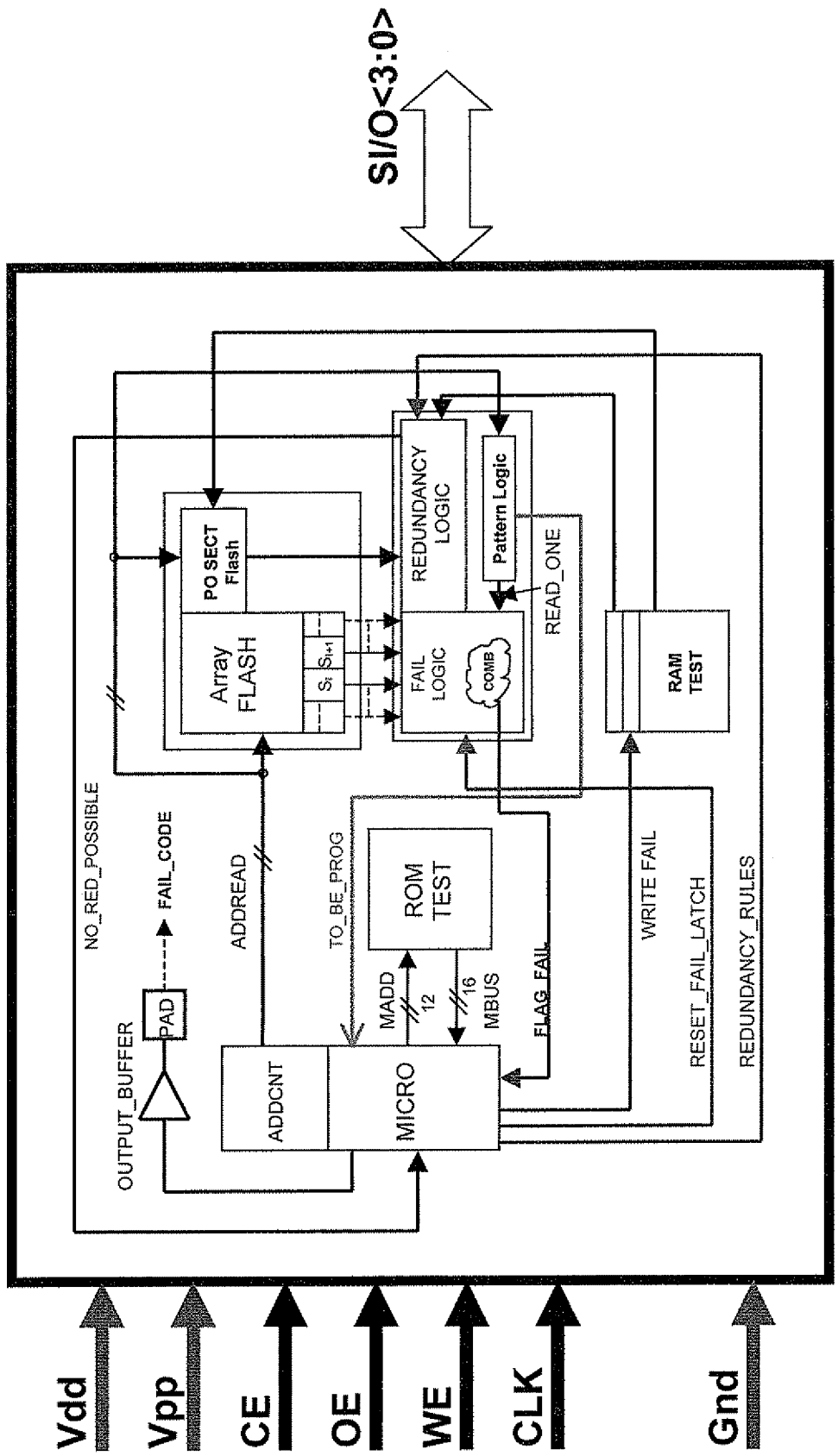
FIG. 2 is a block diagram of the architecture of a device according to the present invention.

A block diagram of this architecture of an embodiment is depicted in FIG. 2. The dedicated additional structures to the existing structures of the microprocessor system for managing the functions of the memory device that have been introduced are substantially represented by the three circuit blocks: PATTERN LOGIC, FAIL LOGIC and REDUNDANCY LOGIC.

For each selected test pattern, Checkerboard, Diagonal, and so on, the process that is autonomously executed by internal structures of the memory device comprises the following steps:
1. writing a selected test pattern in the memory array;
2. verifying that data read from the array corresponds to the written data data;
3. storing the address of an eventual failed element; and
4. substituting, if possible, the failed element with a substitutive redundant element.

The different steps may be described in detail hereinbelow, referring to the circuit scheme of FIG. 2.

Writing the Selected Pattern in the Array

The microcontroller MICRO for managing the device, through the address counter ADDCNT, scans the whole array of memory cells ARRAY. The addresses ADDRESS generated by the address counter ADDCNT are sent to the block PATTERN LOGIC that, in function of the chosen pattern, may output the flag TO_BE_PROG. This flag indicates to the microcontroller that the addressed location of the array may be programmed. The writing algorithm of the test pattern may be resumed as follows:
  a) initialization, executed by the MICRO, of the address counter ADDCNT;
  b) if TO_BE_PROG=0, go to step d);
  c) if TO_BE_PROG=1, then the MICRO carries out the program algorithm;
  d) increment of the address, executed by the MICRO;
  e) if the last location of the array has not been reached, go to step b), otherwise execute the successive step.

Verification of the Pattern and Storage of the Failures

In this phase a verification of the accuracy of the PATTERN previously written in the array ARRAY is carried out to locate eventual discrepancies indicative of physical failures in the array. The verification is carried out by reading all the bits on the addressed column. An eventual discrepancy from the expected value indicates the presence of a fail in the column. This event is stored in a latch of the block FAIL LOGIC.

Figure 3:
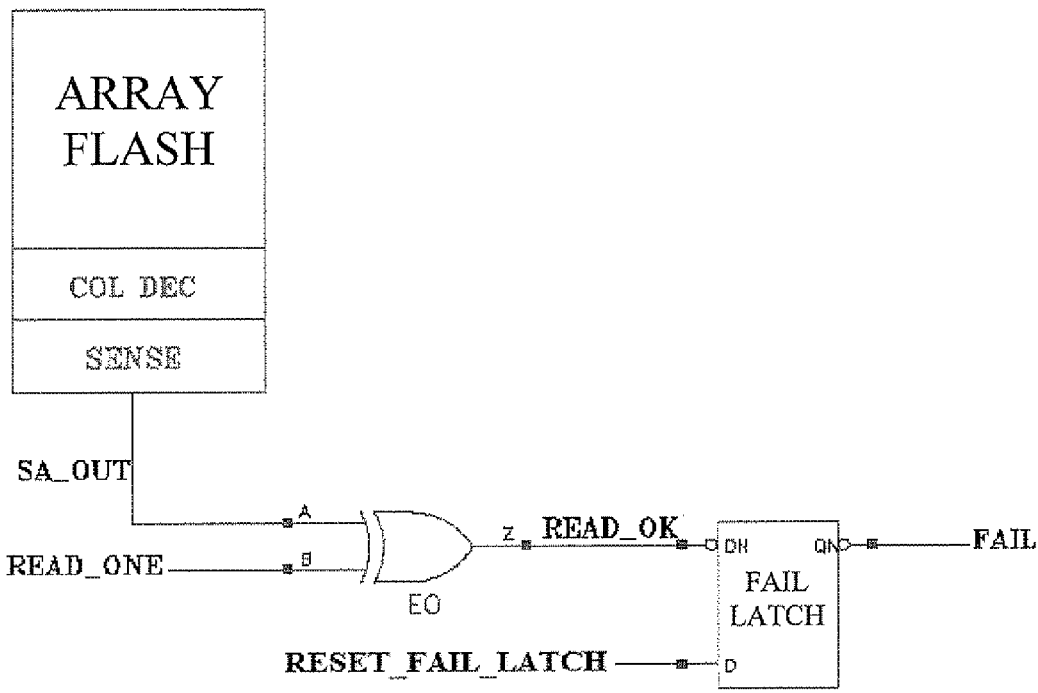
FIG. 3 is a detailed circuit schematic of the FAIL LOGIC block of the architecture of the device according to the present invention.

FIG. 3 shows the architecture of the logic that drives each LATCH_FAIL of the block. According to a feature of this architecture, the driving logic of each LATCH_FAIL is input with the logic value generated on the output node SA_OUT of a respective sense amplifier of the bank of sense amplifiers SENSE of the array of memory cells and the expected logic value READ_ONE, combined by the logic XOR gate, generates the resulting logic value READ_OK that is stored in the LATCH_FAIL.

In practice, the failures eventually detected on the column are stored in the LATCH_FAIL, and the addresses of the columns that contained failures are stored in a memory buffer RAM_TEST to be successively substituted with redundancy columns. The read algorithm of the pattern may be resumed as follows:

a) initialization, executed by the MICRO, of the address counter ADDCNT;
b) resetting of the related LATCH_FAIL through the command RESET_FAIL_LATCH of the microprocessor;
c) reading of the addressed bit and comparison with the expected value given by the signal READ_ONE;
d) if the read value differs from the expected one, the LATCH_FAIL stores the event that a discrepancy between the expected value and the read value has occurred;
e) incrementing of the row address and iteration from point (c) up to the completion of the column scanning;
f) control of the output of the block FAIL_LOGIC:
  1. if the output is high (presence of a FAIL), storing of the current address of the fail column in a memory buffer RAM_TEST through the write signal WRITE_FAIL,
  2. if the output is low, the addressed column does not contain failures, and the successive step is carried out; and
g) incrementing of the column address and iteration from the step b) up to the completion of the scanning of the whole array.

Figure 4:
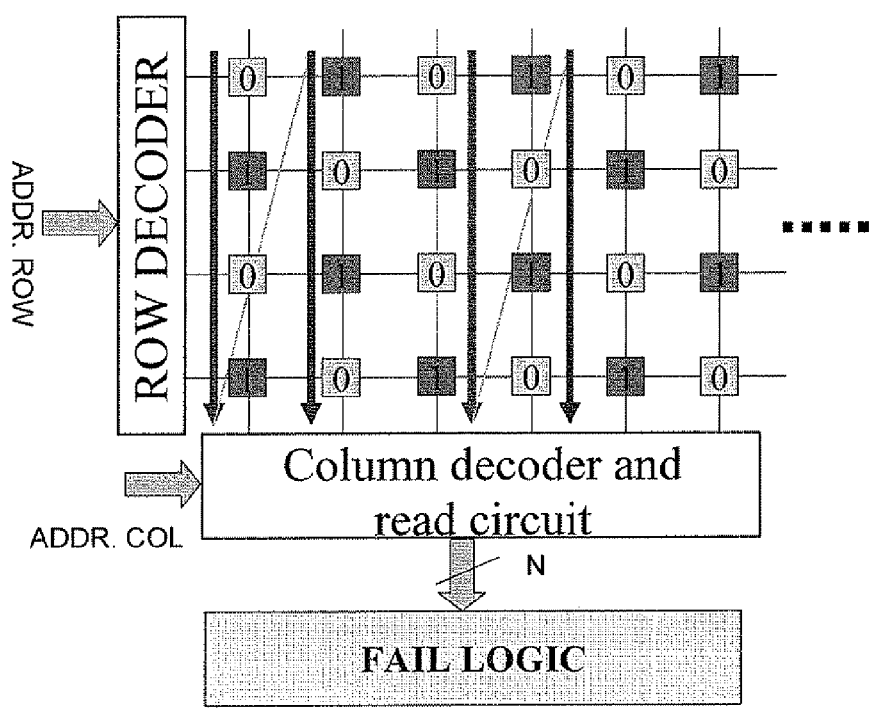
FIG. 4 is a scheme that shows the connections of the logic circuitry of the FAIL LOGIC block at the output of the read-sense amplifiers of the array of the device according to the present invention.

Clearly, verification may take place for a column of cells at the time or alternatively it may be carried out on a certain number N of columns, in case the memory architecture contemplates a parallelism that allows to read N columns in parallel, as indicated in the scheme of FIG. 4. As described above, the verification mode is similar to the program mode: the addresses arrive to the PATTERN LOGIC, that may generate the flag READ_ONE that is XORed with the bit value read from the ARRAY either allowing or not to set the relative LATCH_FAIL of the block FAIL LOGIC.

Clearly, the memory buffer RAM dedicated for storing the addresses of the columns that comprises a failure may have a capacity corresponding to the maximum number of failed elements capable of being replaced with redundant elements, that is, an adequate number of "packets" of single memory cells each appropriate to store the address of a failed column. The buffer RAM_TEST may be defined in one of the RAM arrays that are normally present for other purposes in modern FLASH memory devices (for example, RAM for protections, and so on), by simply increasing its size.

Substitution of Fail Elements with Redundancy Resources

When the scanning of the ARRAY is completed, the MICRO starts communicating with the block REDUNDANCY LOGIC through the signal REDUNDANCY_RULES. The logic of the block REDUNDANCY LOGIC implements the column redundancy rules of the device by considering both the failure information relative to the current test pattern and written in the RAM_TEST and the fail information detected with a previously used test pattern and already permanently stored in a CAM array or (FIG. 2) in the PO_SECTOR.

If the topology of the detected failures with the test pattern just used is such to violate the redundancy rules imposed by the architecture, or the number of fail elements surpasses the number of available resources, the die would not be redundable (i.e., the failed elements may not be substituted with redundant elements) and the block REDUNDANCY LOGIC would send a NO_RED_POSSIBLE flag to the MICRO. The flag would provide through the output pad of the device, and thus to the test machine, a fail code, and the processed die may eventually be discarded.

In the opposite case, a usable redundancy resource may be located and the MICRO may execute the algorithms for writing in the CAM array or in the PO_SECTOR the redundancy information of the new failures, relying on the information provided from the block REDUNDANCY LOGIC and on the fail addresses stored in the RAM TEST. If the verification phase of a particular test pattern terminates without detecting any fail, the SUBSTITUTION phase is skipped.

The advantages provided by this may be as follows:

a) the intervention of the test machine is no longer used for driving the device under test for finding and mapping defects of the array on the available redundancy resources, thus it is possible to carry out the redundancy process on a plurality of devices in parallel for increasing productivity;
b) the reduced number of connection pads machine/device under test enhance the compatibility with the test methods that may be implemented in a Low Pin Count mode;
c) substantial reduction of the time for testing and permanently writing redundancy data compared to prior art techniques;
d) reduction of the complexity of test programs; and
e) reduction of the time-to-market of new FLASH memory devices.

Figure 5:
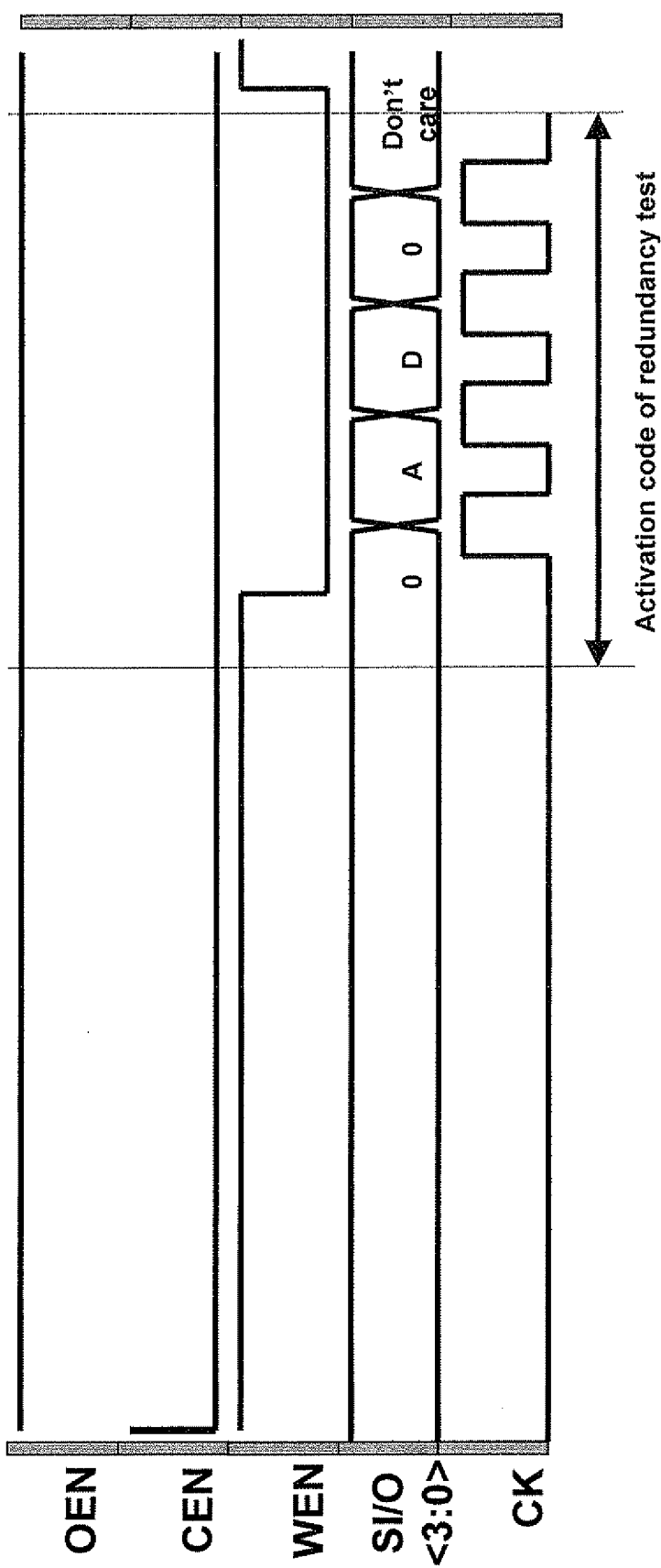
FIGS. 5 and 6 illustrate, respectively, the start-up protocol of the verification process with a certain test pattern and the read protocol of the verification results of the device according to the present invention.
Figure 6:
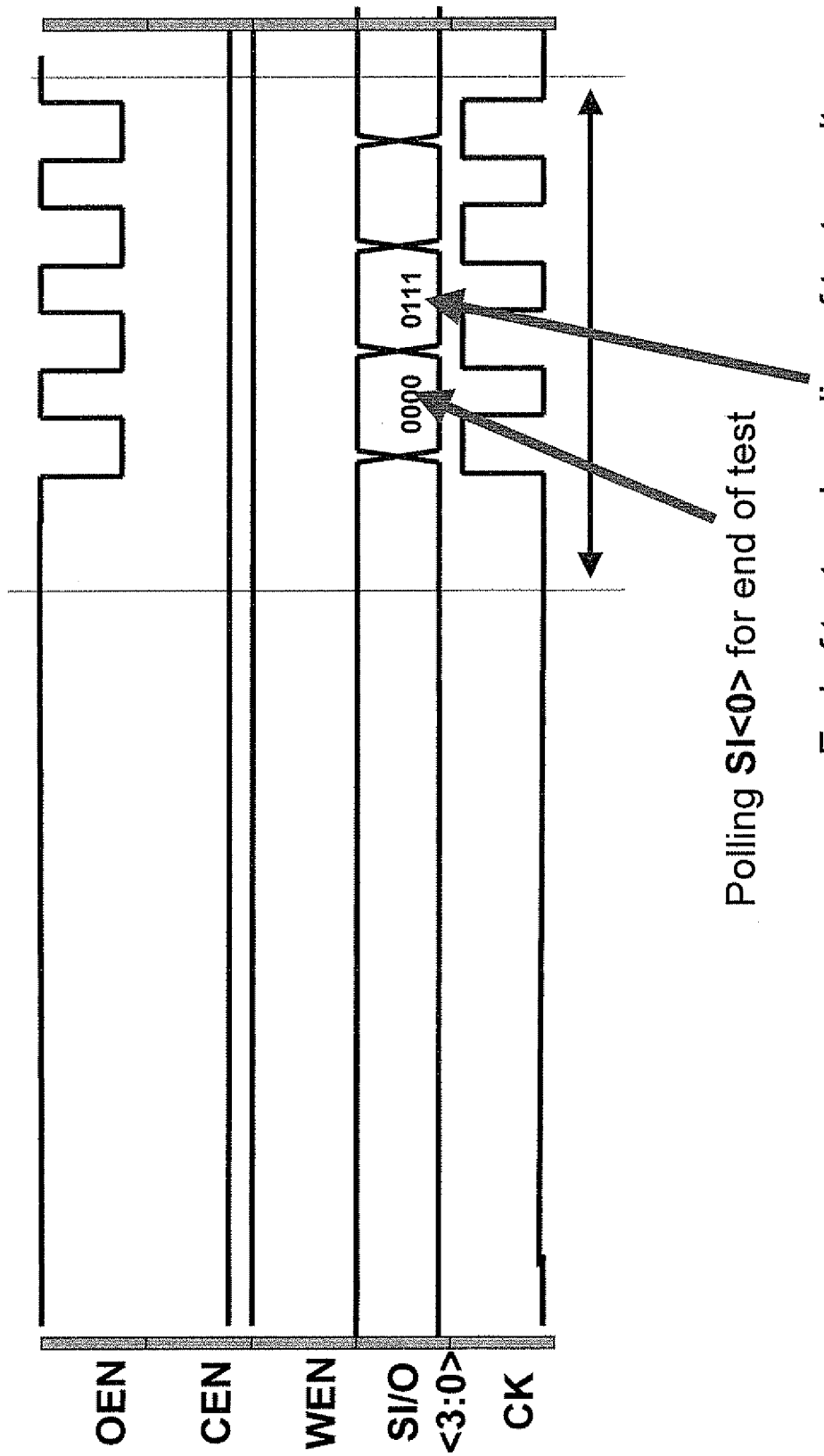

The above advantages may be with a modest increment of overhead area in the single devices, because test structures, logic parts, algorithms and storage devices, most of which are already present in a FLASH memory device, are exploited. As indicated in FIG. 2, the pad connections of a device with the architecture with the EWS test machine may, compatibly with other peculiar features of the device be significantly reduced in number. FIG. 5 illustrates the protocol for starting up the verification process with a certain test pattern and FIG. 6 illustrates the read protocol for the verification of the results.

That which is claimed is:

1. A memory device comprising:
  a fail block to verify and store addresses of failed memory cells of an array of memory cells during execution of a test algorithm, said fail block comprising
    a logic gate having a first input coupled to an output of a sense amplifier, and a second input to receive an expected logic value according to the test algorithm, and
    a resettable bistable circuit to store information of the failed memory cells and coupled to said logic gate;
  a pattern block to be input with addresses of memory cells generated by an internal address counter and to output, based on a pattern for testing an integrity of said array of memory cells, command flags for programming the addressed memory cell to a microcontroller and the expected logic value to the second input of said logic gate; and
  a redundancy block coupled to and interacting with said microcontroller to substitute redundant memory cells for the failed memory cells or to generate a non-redundancy flag.

2. The memory device according to claim 1 wherein said resettable bistable circuit comprises a latch.

3. The memory device according to claim 1 wherein said redundancy block is to implement rules where columns comprising failed memory cells detected during the execution of the test algorithm are mapped onto available redundancy columns of said array of memory cells.

4. The memory device according to claim 1 wherein said array of memory cells comprises a reserved sector being inaccessible by a user and on which mapping data of columns comprising failed memory cells are permanently written.

5. The memory device according to claim 1 wherein said microcontroller comprises a read only memory; and wherein the test algorithm is programmed in said read only memory for managing the memory device.

6. The memory device according to claim 1 wherein said array of memory cells is organized in sectors; and wherein the memory cells of said array of memory cells are located by a row and a column address.

7. The memory device according to claim 1 further comprising:
supply pads, a clock signal pad, a chip enabling command pad, a write enabling command pad, and pads for input/output enabling command, input address, and output memory data; and wherein the memory device is to interact with an electric wafer sort (EWS) test machine to implement the substitution of the redundant memory cells or to generate the non-redundancy flag only through said supply pads, said clock signal pad, said chip enabling command pad, said write enabling command pad, and said pads for input/output enabling command, input address, and output memory data.

8. The memory device according to claim 1 wherein said array of memory cells comprises a FLASH array of memory cells.

9. A FLASH memory device comprising:
an array of FLASH memory cells;
a microcontroller to manage erase, program, erase verify, program verify, and read operations of data in said array of FLASH memory cells;
a logic circuit to verify and store addresses of failed FLASH memory cells during execution of a test algorithm and comprising
a logic gate to detect a discrepancy between an expected logic value according to the test algorithm and a value of a respective FLASH memory cell, the discrepancy indicating the respective FLASH memory cell comprises a failed FLASH memory cell, and
a latch coupled to an output of said logic gate to store an indication of the failed FLASH memory cell;
a pattern logic circuit to be input with the addresses of failed FLASH memory cells and to output, based on a pattern for testing an integrity of said array of FLASH memory cells, command flags to program the addressed FLASH memory cell sent to said microcontroller and the expected logic value applied to an input of said logic circuit; and
a redundancy logic circuit coupled to said microcontroller to substitute for columns comprising failed FLASH memory cells or to generate a non-redundancy flag.

10. The FLASH memory device according to claim 9 wherein said redundancy logic circuit is to implement rules where columns comprising failed FLASH memory cells detected during the execution of the test algorithm are mapped onto available redundancy columns of said array of FLASH memory cells.

11. The FLASH memory device according to claim 9 wherein said array of FLASH memory cells comprises a reserved sector being inaccessible by a user and on which mapping data of the columns comprising failed FLASH memory cells are permanently written.

12. The FLASH memory device according to claim 9 wherein said microcontroller comprises a read only memory; and wherein the test algorithm is programmed in said read only memory for managing the FLASH memory device.

13. The FLASH memory device according to claim 9 wherein said array of FLASH memory cells is organized in sectors; and wherein the FLASH memory cells of said array of FLASH memory cells are located by a row and a column address.

14. The FLASH memory device according to claim 9 further comprising
supply pads, a clock signal pad, a chip enabling command pad, a write enabling command pad, and pads for input/output enabling command, input address, and output memory data; and wherein the FLASH memory device is to interact with an electric wafer sort (EWS) test machine to implement the substitution for columns comprising failed FLASH memory cells or to generate the non-redundancy flag only through said supply pads, said clock signal pad, said chip enabling command pad, said write enabling command pad, and said pads for input/output enabling command, input address, and output memory data.

15. A method comprising:
writing a test pattern into an array of memory cells;
detecting failed memory cells by determining discrepancies between values stored in the memory cells and respective expected logic values based upon a testing algorithm and the test pattern;
storing addresses of the failed memory cells;
outputting, based on the test pattern, command flags to a microcontroller to program addressed memory cells;
outputting, based on the test pattern, the expected logic value of addressed memory cells; and
autonomously, within the memory device, substituting redundant memory cells for the failed memory cells or generating a non-redundancy flag.

16. The method according to claim 15 further comprising implementing rules where columns comprising failed memory cells detected during an execution of the test algorithm are mapped onto available redundancy columns of the array of memory cells.

17. The method according to claim 15 wherein the array of memory cells comprises a reserved sector being inaccessible by a user; and the method further comprises
writing onto the reserved sector a mapping data of columns comprising the failed memory cells.

18. The method according to claim 15 wherein the microcontroller comprises a read only memory; and the method further comprises
programming the test algorithm in the read only memory for managing the memory device.

* * * * *